United States Patent [19]

Audbert

[11] Patent Number: 5,179,324
[45] Date of Patent: Jan. 12, 1993

[54] DIMMER WITH REDUCED FILTERING LOSSES

[75] Inventor: Jean Audbert, Peymeinade, France
[73] Assignee: Legrand, Limoges, France
[21] Appl. No.: 822,986
[22] Filed: Jan. 21, 1992

[30] Foreign Application Priority Data

Jan. 21, 1991 [FR] France .................. 91 00624

[51] Int. Cl.$^5$ .............................................. G05F 5/02
[52] U.S. Cl. .................. 315/194; 315/DIG. 4;
  315/283; 315/209 R; 315/225; 315/244;
  315/199; 315/226; 323/300; 323/324; 323/326;
  323/905; 307/632
[58] Field of Search .............. 315/194, 195, 283, 210,
  315/209 R, 224, 241 R, 244, 245, 199, 225, 226,
  DIG. 4; 323/300, 324, 326, 905, 239; 307/632

[56] References Cited

U.S. PATENT DOCUMENTS 4,876,498  10/1989  Luchaco et al. .................. 323/300
4,954,768   9/1990  Luchaco et al. .................. 315/DIG. 4

Primary Examiner—Paul M. Dzierzynski
Assistant Examiner—MIchael B. Shingleton
Attorney, Agent, or Firm—Young & Thompson

[57] ABSTRACT

A dimmer with reduced filtering losses is connected into a conductor supplying power to a load from a mains power supply. It conventionally comprises a triac in series with a filter inductor between an input terminal and an output terminal and a circuit generating triggering signals for the triac. To reduce the losses in the inductor, which conventionally is in series with the load at all times but is active only during moments following triggering of the triac, to reduce the amplitude of the transient currents, a second triac triggered by a circuit with a time-delay greater than the time constant defined by the filter capacitor and inductor diverts the load current. An auxiliary low-value inductor attenuates transients due to triggering of the second triac.

5 Claims, 1 Drawing Sheet

DIMMER WITH REDUCED FILTERING LOSSES

BACKGROUND OF THE INVENTION

1. Field of the invention

The invention concerns a dimmer for a load such as an incandescent lamp connected to an alternating current mains power supply and adapted to be inserted into a conductor supplying power to the load via input and output terminals and comprising a triac with two main terminals of which a first is connected to the input terminal and the second is connected to the output terminal, a control circuit sending to the triac a triggering signal synchronized to the voltage between the terminals with a variable time-delay, a filter inductor with one end connected to the second main terminal of the triac and a second end connected to the output terminal and a filter capacitor connected between the input and output terminals.

Dimmers comprising a triggered conduction switching device and a control circuit adapted to trigger conduction with a variable time-delay from the zero crossing of the voltage across the switching device have been known in themselves for a long time. The development of semiconductor devices, thyristors and triacs mass produced at low cost has made it possible to extend the use of such dimmers to domestic applications such as controlling the brightness of light fittings.

The principle of controlling the power supplied to a load by the variable time-delay triggering of the switching device in which the impedance of this device changes in a time that is very short compared to the period of the AC line voltage from a value that is very high compared with the load impedance to a value that is negligible compared to this impedance causes significant discontinuity in the voltage across the load. Unless special precautions are taken, especially if the load absorbs essentially active power, each triggering causes a transient current demand on the mains power supply. These transients constitute undesirable interference.

Dimmers are therefore provided with lowpass type filters conventionally comprising a series inductor and a capacitor shunting the load. The values of these components are determined in relation to the impedance of the load so that the impedance of the inductor is low compared to the load impedance at the AC line voltage frequency and high compared to the load impedance at the harmonic frequencies caused by triggering the switch device while the impedance of the capacitor is respectively high and low at these same frequencies.

Although the losses at the frequencies in question, which range from 50 Hz to a few tens of kHz, may be negligible in the case of capacitors, this is not so in the case of inductors whose internal resistance cannot be eliminated, even by winding them on toroidal ferromagnetic cores. These losses represent a significant part of the power dissipated by the dimmer.

As the size of a component must increase with the power that it dissipates to prevent excessive temperature rises and since the price of an inductor increases in proportion to its size, in dimmers for domestic applications at least the filter inductor becomes the most costly, bulky and power dissipating component.

The invention is therefore directed to reducing losses in the filter inductor to reduce the cost and size for the same load power or to increase the power rating for the same cost and size.

SUMMARY OF THE INVENTION

The present invention consists in dimmer for a load such as an incandescent lamp connected to an alternating current mains power supply adapted to be inserted into a conductor supplying power to the load via input and output terminals and comprising a triac with two main terminals of which a first is connected to the input terminal and the second is connected to the output terminal, a control circuit sending to the triac a triggering signal synchronized to the voltage between the terminals with a variable time-delay, a filter inductor with one end connected to the second main terminal of the triac and a second end connected to the output terminal, a filter capacitor connected between the input and output terminals and a second triac connected between the input terminal and the second end of the inductor, the control circuit sending a second control signal to the second triac with a fixed time-delay relative to the first.

The inventors have found that losses in the filter inductor are caused by the fundamental frequency current for the most part although this inductor plays an active role only in the moments following triggering of the triac in which the rate of increase of the current is attenuated by the resultant voltage across the inductor. The triggering of the second triac delayed relative to that of the basic triac short-circuits the first triac and the series connected filter inductor.

In a preferred embodiment the fixed time-delay of the second triggering signal relative to the first is greater than the time constant defined by the combination of the filter capacitor and inductor.

The duration and the waveform of the voltage peak across the filter inductor are known to be a function of the time constant defined by the inductor and the capacitor so that the triggering of the second triac occurs after most of the voltage peak has been absorbed.

The dimmer preferably further comprises a stabilizing circuit for low loads comprising a series resistor/capacitor circuit shunting the filter capacitor.

At low loads the filter comprising the filter capacitor and inductor provides very little damping; the current at the onset of triac triggering is therefore a damped pseudoperiodic current which may turn off the triac. The resistor/capacitor circuit introduces additional damping so that the dimmer can operate correctly at lower loads. Note that this feature is known but that it is combined with the essential characteristic of the invention to widen the range of power over which the dimmer can operate.

In a preferred embodiment of the invention an auxiliary inductor whose value is substantially lower than that of the filter inductor is connected between the latter and the output terminal. This auxiliary inductor has a low inductance and therefore a low resistance and cooperates with the filter capacitor to provide additional interference suppression in the dimmer when the second triac is triggered, at which time a residual voltage is present across the combination of the first triac and the filter inductor.

The triac control circuit preferably comprises a power supply circuit with a reservoir capacitor adapted to be charged via a diode by the voltage between the input and output terminals. This yields a device in which the power to supply the control circuits is taken off in series with the load from the voltage between the input and output terminals of the dimmer before the first triac is triggered. This known arrangement, sometimes called a dipole arrangement, simplifies the wiring by eliminating the need for a connection to the AC line voltage to supply power to the control circuit; it is feasible because the power requirement of the control circuit is low and the voltage at the input of the power supply circuit needed for this circuit to operate correctly is obtained between the input and output terminals of the dimmer for time-delays for triggering the first triac relative to the zero crossing of the line voltage which do not introduce any significant restriction on the range of adjustment of the dimmer.

The features and advantages of the invention will emerge from the following description given by way of example with reference to the appended drawings.

DETAILED DESCRIPTION OF THE INVENTION

Figure 1:
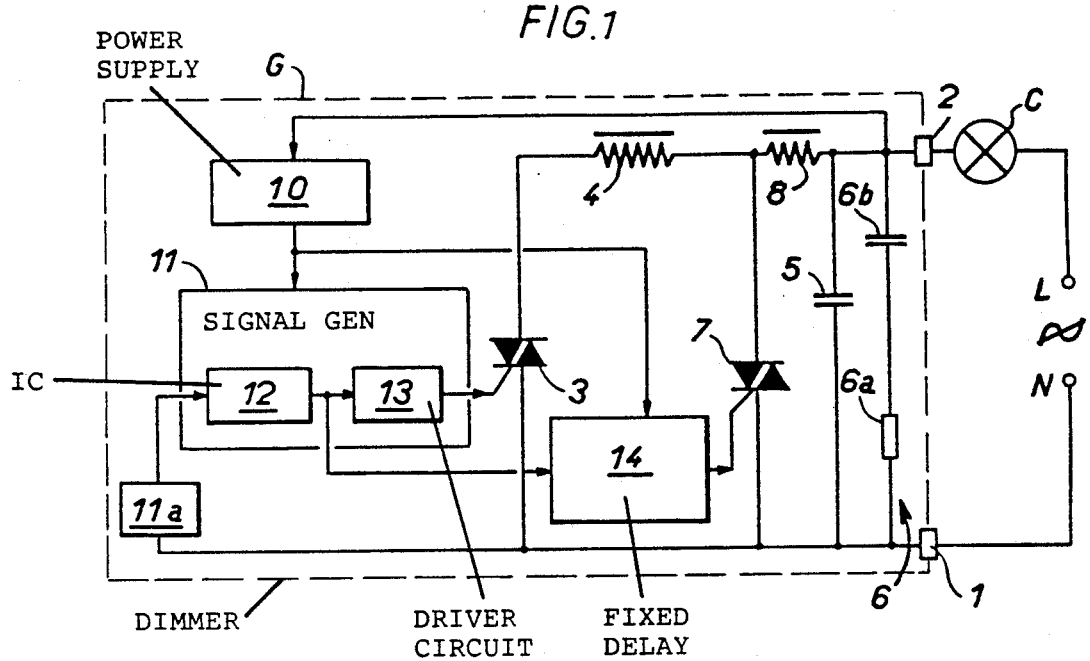
FIG. 1 is a simplified block diagram of a dimmer in accordance with the invention.

In the chosen embodiment shown in FIG. 1 a dimmer G is connected in series with a load C such as a halogen incandescent lamp between the poles N and L of a low-voltage AC mains power supply. The dimmer G has an input terminal 1 connected to the pole N and an output terminal 2 connected to the load C. The input terminal 1 constitutes a reference conductor for the dimmer.

The dimmer G comprises a first triac 3 with one main terminal connected to the input terminal 1 and the second main terminal connected to one end of a filter inductor 4 whose other end is connected to one end of an auxiliary inductor 8 whose other end is connected to the output terminal 2.

A second triac 7 is connected between the input terminal 1 and the common point of the inductors 4 and 8. A filter capacitor 5 and a damping circuit 6 comprising a resistor 6a on the input terminal 1 side and a capacitor 6b on the output terminal 2 side are connected between the input terminal 1 and the output terminal 2.

A power supply circuit 10 has an input connected to the output terminal 2 and supplies power to a control circuit which comprises a circuit 11 generating triggering signals for the first triac 3 operating in conjunction with a control module 11a. The signal generator circuit 11 comprises an integrated circuit 12 designed to control a prior art dimmer which in response to control signals from the control module 11a sends out synchronously with the voltage between the main terminals of the triac pulses at twice the AC line voltage frequency with a time-delay determined by the control signals. The signal generator circuit 11 further comprises a driver circuit 13 which in response to the synchronized pulses with the controlled time-delay sent by the integrated circuit 12 injects charge into the gate terminal of the triac 3 to trigger it into its conducting state.

Note that the triac 3, the series connected inductors 4 and 8, the filter capacitor 5, the damping circuit 6, the power supply circuit 10, the triggering signal generator circuit 11 and the associated control module 11a constitute a conventional dimmer except that the filter inductor is divided in two, the inductor 4 having specifications comparable to those of the conventional inductor.

The additional triac 7 connected between the input terminal 1 and the common point of the inductors 4 and 8 receives at its gate terminal a triggering signal sent by a circuit 14 which receives at its input the pulses output by the integrated circuit 12 and converts them into triggering signals delayed by a fixed amount relative to the pulses, in this instance approximately 250 $\mu$s.

As with the operation of a conventional dimmer, appropriate operation of a control device has activated the integrated circuit and varied the variable time-delay relative to the zero crossing of the voltage between the main terminals of the triac 3. This triac is turned off at the zero crossing of the voltage applied to it and remains turned off, even though the voltage applied to it begins to increase, until a triggering signal at its gate terminal turns it on. Throughout this period the voltage between the triac terminals is substantially equal to the instantaneous AC line voltage, the impedance of the load C being negligible in comparison with the impedance of the turned off triac.

When the triac 3 is triggered the increase in the current in the filter inductor (here inductor 4+inductor 8), this current being the sum of the discharge current of the filter capacitor 5 and the current flowing through the load C, causes a voltage to appear between the second main terminal of the triac 3 and the output terminal 2. This voltage is a damped oscillation having a rising edge followed by a falling edge superimposed on the voltage created by the main current with a pseudoperiod in the order of 50 to 100 $\mu$s related to the time constant and dependent on the values of the inductors 4+8 and the capacitor 5. In practise after 200 to 250 $\mu$s the increase in this transient voltage is cancelled out.

In a conventional dimmer the filter inductor remains in circuit until the triac 3 is turned off when the current in the load C falls to zero at the end of the AC line voltage period; however, in accordance with the invention the second triac 7 receives the second triggering signal delayed relative to the first by approximately 250 $\mu$s, in other words, after 2 to 5 pseudoperiods of the filter system, that is to say after the effective extinction of the transient voltage created by the inductors 4 and 8. Because of the voltage drop generated at the main inductor 4, the second triac 7 is triggered when the first triac 3 is turned off and the current in the inductor 4 is cut off. The triggering of the second triac 7 causes an increase in the current in the inductor 8 and the appearance of a transient voltage across this inductor associated with the filter conductor to reduce the reaction on the AC line voltage constituting interference. It will be remembered that the auxiliary inductor 8 has a substantially lower inductance than the filter inductor 4, in a ratio of 1/15, for example. Also, although the transient voltage peak when the first triac 3 is triggered may be as high as 300 V (for an rms AC line voltage of 200 V), the transient voltage peak when the second triac 7 is triggered hardly exceeds 3 V.

The damper circuit 6 comprising the resistor 6a and the capacitor 6b is provided to introduce additional damping into the oscillatory circuit comprising the inductors 4 and 8 and the capacitor 5 when the damping due to the load C, whose resistance is too high, is insufficient and when, following half a pseudoperiod of the low damping circuit, the current flowing in the triac 3 between its main terminals falls below the current needed to maintain the discharge and the triac 3 turns off. This turning off is random and causes a phenomenon known as "flicker" because of the condition observed in an incandescent lamp load.

Figure 2:
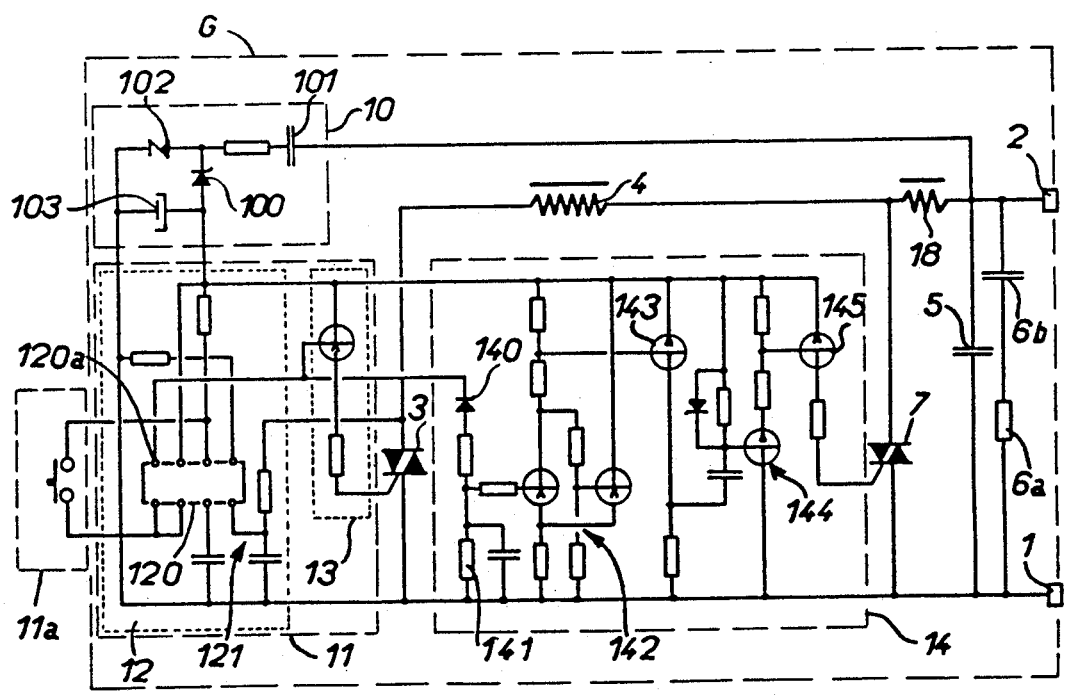
FIG. 2 is a more detailed circuit diagram of a dimmer in accordance with the invention.

FIG. 2 reproduces FIG. 1 with more detail of the circuits defined functionally with reference to FIG. 1.

The power supply 10 is connected between the input terminal 1 and the output terminal 2. The voltage between the terminals 1 and 2, which is the instantaneous AC line voltage if the triacs 3 and 7 are not triggered, is applied through a capacitor 101 and a current limiter resistor to a diode 100 which charges a reservoir capacitor 103. A zener diode 102 in parallel with the capacitor 103 determines the value of the rectified voltage supplying the various circuits.

The integrated circuit 120 associated with the control module 11a is a conventional device for controlling a triac variable speed drive. It supplies at its output 120a pulses at twice the mains frequency synchronized to the voltage applied to the triac 3 and sensed by the RC circuit 121. By means of appropriate momentary action contacts on the pushbutton of the control module 11a synchronized pulses are caused to appear, the time-delay of these pulses relative to the zero crossing of the voltage at the triac 3 is varied and the pulses are eliminated.

The pulses from the output 120a of the integrated circuit 120 are applied to a driver circuit 13 comprising an emitter follower transistor connected to the gate terminal of the triac 3.

These pulses are also applied through a diode 140 to an RC integrator 141 in a delay circuit 14 whose time constant is the time-delay required for triggering the second triac 7. For a time-delay of 250 µs the time constant is about 150 µs.

The integrated pulses are applied to a flip-flop 142 comprising two transistors with their emitters connected together and the collector of one connected to the base of the other. This flip-flop outputs a pulse with a duration of 250 µs in response to each integrated pulse.

This pulse is applied through a splitter stage 143 to an asymmetrical differentiator 144 which outputs a pulse in response to the trailing edge of the pulse produced by the flip-flop 142. This pulse is applied to a transistor 145 configured as a driver circuit similar to the driver circuit 13 to control triggering of the triac 7.

Of course, the invention is not limited to the examples described but encompasses all variant executions thereof within the scope of the claims.

In particular the delay circuit 14 and the variable time-delay control circuit 11 can be of any design provided that they implement analogous functions. Although the power supply 10 has the advantage of requiring no dedicated connection to the mains supply, it goes without saying that a connection to the mains supply would not change the essential nature of the invention in any way. Whenever the tolerance in respect of the level of interference fed back into the mains supply is not particularly constraining, the inductor 8 may be dispensed with.

Also, note that the inductors 4 and 8 may be wound on a common core, the triac 7 being connected to an appropriate intermediate point on the winding.

THERE IS CLAIMED:

1. Dimmer for a load such as an incandescent lamp connected to an alternating current mains power supply adapted to be inserted into a conductor supplying power to the load via input and output terminals and comprising a triac with two main terminals of which a first is connected to the input terminal and the second is coupled to the output terminal, a control circuit sending to the triac a triggering signal synchronized to the voltage between the terminals with a variable timedelay, a filter inductor with one end connected to the second main terminal of the triac and a second end coupled to the output terminal, a filter capacitor connected between the input and output terminals and a second triac connected between the input terminal and the second end of the inductor, the control circuit sending a second control signal to the second triac with a fixed time-delay relative to the first.

2. Dimmer according to claim 1 wherein said filter capacitor and inductor jointly determine a time constant and said time-delay is greater than said time constant.

3. Dimmer according to claim 1 further comprising a stabilizing circuit for low loads comprising a series resistor-capacitor circuit shunting said filter capacitor.

4. Dimmer according to claim 1 further comprising an auxiliary inductor of substantially lower value than said filter inductor connected between the latter and said output terminal.

5. Dimmer according to claim 1 wherein said triac control circuit comprises a power supply circuit with a reservoir capacitor adapted to be charged via a diode by the voltage between said input and output terminals.

* * * * *